United States Patent
Qin et al.

(10) Patent No.: US 10,720,672 B2
(45) Date of Patent: Jul. 21, 2020

(54) SERIES-MULTIPLE BATTERY PACK MANAGEMENT SYSTEM

(71) Applicant: AUTEL ROBOTICS CO., LTD., Shenzhen, Guangdong (CN)

(72) Inventors: Wei Qin, Guangdong (CN); Shixing Zhao, Guangdong (CN)

(73) Assignee: AUTEL ROBOTICS CO., LTD, Shenzhen (CN)

( * ) Notice: Subject to any disclaimer, the term of this patent is extended or adjusted under 35 U.S.C. 154(b) by 184 days.

(21) Appl. No.: 15/975,351

(22) Filed: May 9, 2018

(65) Prior Publication Data
US 2018/0309171 A1    Oct. 25, 2018

Related U.S. Application Data (63) Continuation of application No. PCT/CN2017/117217, filed on Dec. 19, 2017.

(30) Foreign Application Priority Data

Apr. 24, 2017 (CN) .......................... 2017 2 0435994

(51) Int. Cl.
*H01M 10/42* (2006.01)
*H01M 2/10* (2006.01)
(Continued)

(52) U.S. Cl.
CPC ..... *H01M 10/4207* (2013.01); *H01M 2/1016* (2013.01); *H01M 10/425* (2013.01);
(Continued)

(58) Field of Classification Search
CPC .................. H01M 10/4207; H01M 2/1016
See application file for complete search history.

(56) References Cited

U.S. PATENT DOCUMENTS

2015/0032394 A1* 1/2015 Kimura ............. G01R 31/3835
702/63
2017/0030976 A1* 2/2017 Suzuki ................. G01R 31/396

FOREIGN PATENT DOCUMENTS

CN        104574384 A    4/2015
CN        105957107 A    9/2016
(Continued)

OTHER PUBLICATIONS

Supplementary European Search Report; Search Completed Jul. 25, 2018; EP17832181.
(Continued)

*Primary Examiner* — Richard V Muralidar (57) ABSTRACT

The present application discloses a series-multiple battery pack management system, including: a plurality of series-multiple battery packs; a plurality of electric quantity measurement modules, respectively connected to the plurality of series-multiple battery packs to obtain parameter information of the plurality of series-multiple battery packs, and further obtain compensation parameters according to the parameter information; and a controller, respectively connected to the plurality of electric quantity measurement modules, and configured to manage the plurality of series-multiple battery packs according to the compensation parameters. By using the series-multiple battery pack management system of the present application, relatively accurate current electric quantity information and a relatively accurate current battery use status can be obtained, so that the battery electric quantity of the battery management system can be measured more accurately.

13 Claims, 4 Drawing Sheets

(51) Int. Cl.
*H02J 7/00* (2006.01)
*H01M 10/44* (2006.01)
*H01M 10/48* (2006.01)
*G01R 31/382* (2019.01)
*G01R 31/396* (2019.01)

(52) U.S. Cl.
CPC ....... *H01M 10/441* (2013.01); *H01M 10/443* (2013.01); *H01M 10/48* (2013.01); *H02J 7/007* (2013.01); *H02J 7/0014* (2013.01); *H02J 7/0021* (2013.01); *H02J 7/0047* (2013.01); *G01R 31/382* (2019.01); *G01R 31/396* (2019.01); *H01M 2/1077* (2013.01); *H01M 2010/4271* (2013.01)

(56) References Cited

FOREIGN PATENT DOCUMENTS

| CN | 105957109 A | 9/2016 |
| CN | 205882735 U | 1/2017 |
| CN | 205901329 U | 1/2017 |
| CN | 106461730 A | 2/2017 |
| CN | 205986249 U | 2/2017 |
| CN | 106875415 A | 6/2017 |
| CN | 106875419 A | 6/2017 |
| JP | 2010-124629 A | 6/2010 |
| KR | 20160097873 A | 8/2016 |

OTHER PUBLICATIONS

Krishneel Chaudhary, et al; "Robust real-time visual tracking using dual-frame deep comparison network integrated with correlation filters", Abstract Only; Published n 2017 IEEE/RSJ International Conference on Intelligent Robots and Systems (IROS), Sep. 24-28, 2017.
H. Cheng, et al; "An Autonomous Vision-Based Target Tracking System for Rotorcraft Unmanned Aerial Vehicles", Conference Paper Sep. 2017; IEEE/TSJ International Conference on Intelligent Robots and Systems (IROS).
International Search Report dated Oct. 16, 2018; PCT/CN2018/073272.
Supplementary European Search Report completed Aug. 2, 2019; Appln. No. EP 18 72 5381.
International Search Report dated Mar. 8, 2018; PCT/CN2017/117217 *English Translation Not Yet Available*.

* cited by examiner

SERIES-MULTIPLE BATTERY PACK MANAGEMENT SYSTEM

CROSS-REFERENCE

This application is a continuation application of International Application No. PCT/CN2017/117217, filed Dec. 19, 2017, which claims priority of Chinese Patent Application No. 201720435994.9, filed Apr. 24, 2017, both of which are incorporated herein by reference in its entirety.

TECHNICAL FIELD

The present application relates to the field of energy storage technologies, and specifically, to a series-multiple battery pack management system.

RELATED ART

With the development of technologies, series-multiple lithium battery technical solutions are increasingly widely applied to such industries as unmanned aerial vehicles, electric vehicles, distributed power systems and mobile terminals. Currently, most series-multiple lithium battery management systems are formed by a microprocessor serving as the core, detection and control modules and the like. Due to a technical limitation such as a high voltage, in a series-multiple battery technical solution, for example, a BQ78350+BQ76930 solution of TI, two measurement chips are generally adopted. However, the technical solution has the following disadvantage: for example, the measurement precision is greatly affected by the environment; a measurement error is relatively great after a plurality of cycles; or there is no corresponding proper measure for an emergency situation such as an electric quantity jump. The unmanned aerial vehicle industry has a relatively high requirement on the measurement precision of a battery management system. However, the current series-multiple lithium battery management system cannot satisfy the requirement of the unmanned aerial vehicle on the measurement precision of the battery management system.

SUMMARY

To resolve the foregoing technical problem, embodiments of the present application provide a series-multiple battery pack management system, including:

a plurality of series-multiple battery packs; a plurality of electric quantity measurement modules, respectively connected to the plurality of series-multiple battery packs; and a controller, respectively connected to the plurality of electric quantity measurement modules, and configured to manage the plurality of series-multiple battery packs.

In some embodiments, the plurality of electric quantity measurement modules obtain parameter information of the plurality of series-multiple battery packs, and obtain compensation parameters according to the parameter information, the controller managing the plurality of series-multiple battery packs according to the compensation parameters.

In some embodiments, the parameter information includes at least one of the following: major loop current information, voltage information of the plurality of series-multiple battery packs, temperature information of the plurality of series-multiple battery packs and percentage information of electric quantity.

In some embodiments, the electric quantity measurement module further includes at least one of the following: a major loop current acquisition unit, connected to a major loop, and configured to acquire the major loop current information; a battery pack voltage acquisition unit, connected to the series-multiple battery packs connected to the electric quantity measurement modules, and configured to acquire the voltage information of the series-multiple battery packs; and a temperature acquisition unit, connected to the series-multiple battery packs connected to the electric quantity measurement modules, and configured to acquire the temperature information of the series-multiple battery packs.

In some embodiments, the electric quantity measurement module further includes an impedance tracking unit, configured to track impedance of the series-multiple battery packs connected to the electric quantity measurement modules and obtain aging information of the series-multiple battery packs according to the impedance of the series-multiple battery packs.

In some embodiments, a communication isolation module is disposed between the electric quantity measurement modules and the controller; the controller obtains, by using the communication isolation module, the compensation parameters obtained by the plurality of electric quantity measurement modules; and the plurality of electric quantity measurement modules obtains a measurement result obtained by the controller by doing statistics on the compensation parameters.

In some embodiments, the series-multiple battery pack management system further includes an inter-battery pack balancing module, where one side of the inter-battery pack balancing module is connected to at least two of the series-multiple battery packs and the other side is connected to the controller, the inter-battery pack balancing module being configured to balance a voltage among the plurality of series-multiple battery packs under the control of the controller.

In some embodiments, the series-multiple battery pack management system further includes a plurality of intra-battery pack balancing modules, where one side of each of the plurality of intra-battery pack balancing modules is connected to one of the series-multiple battery packs and the other side is connected to the electric quantity measurement module connected to the series-multiple battery pack, the plurality of intra-battery pack balancing modules being configured to balance voltages of batteries within the plurality of series-multiple battery packs under the control of the electric quantity measurement modules.

In some embodiments, the series-multiple battery pack management system further includes a voltage step-up driving module, where one side of the voltage step-up driving module is connected to one of the electric quantity measurement modules and the other side is connected to the controller, the electric quantity measurement module of the series-multiple battery pack outputting, under the triggering of the measurement result, a voltage step-up signal used for driving the voltage step-up driving module to be turned on, so that the voltage step-up driving module controls a major loop switch to be switched off.

In some embodiments, the series-multiple battery pack management system further includes a reverse connection prevention module, where the reverse connection prevention module is connected in parallel to the major loop switch, and is configured to control, during reverse charging, the major loop switch to be switched off.

In some embodiments, the series-multiple battery pack management system further includes: a precharge module, respectively connected to the plurality of series-multiple battery packs and the controller, and configured to be turned on under the control of the controller, to charge the plurality of series-multiple battery packs in a trickle charging manner; and a predischarge module, respectively connected to the plurality of series-multiple battery packs and the controller, and configured to be turned on under the control of the controller, to discharge the plurality of series-multiple battery packs in a trickle discharging manner.

In some embodiments, the series-multiple battery pack management system further includes a battery self-discharge module, connected to the controller, and turned on when the battery is in the storage state under the control of the controller, to control the series-multiple battery pack to be discharged in a small current discharging manner.

In some embodiments, the series-multiple battery pack management system further includes a major loop sense resistor disposed on a major loop, where the major loop sense resistor acquires a current of the major loop, and calculates a current value of the major loop by using a resistance value and a voltage value of the major loop sense resistor, the major loop sense resistor being configured to monitor and manage the current of the major loop.

In some embodiments, the series-multiple battery pack management system further includes a resetting module, connected to the controller and configured to reset the controller.

According to the series-multiple battery pack management system and the unmanned aerial vehicle using the same that are provided in the embodiments of the present application, in-depth learning on a status of the series-multiple battery pack is performed by using the electric quantity measurement module. Compensation for the parameter information of the series-multiple battery pack is made according to a result of the in-depth learning, to obtain a relatively accurate parameter of the series-multiple battery pack, that is, a compensation parameter. A controller does statistics on the compensation parameters of the plurality of series-multiple battery packs, to select a parameter that can represent current electric quantity information as a measurement result, so that relatively accurate current electric quantity information and a relatively accurate current battery use status can be obtained. Therefore, the battery electric quantity of the battery management system can be measured more accurately.

BRIEF DESCRIPTION OF THE DRAWINGS

To describe the technical solutions in specific implementations of the present application or in the prior art more clearly, the following briefly describes the accompanying drawings required for describing the specific implementations or the prior art. Apparently, the accompanying drawings in the following description show some implementations of the present application, and a person of ordinary skill in the art may still derive other drawings from these accompanying drawings without creative efforts.

DETAILED DESCRIPTION

The following clearly and completely describes the technical solutions in the present application with reference to the accompanying drawings. Apparently, the described embodiments are some of the embodiments of the present application rather than all of the embodiments. All other embodiments obtained by a person of ordinary skill in the art based on the embodiments of the present application without creative efforts shall fall within the protection scope of the present application.

In the descriptions in the present application, it should be noted that, unless otherwise clearly stipulated and limited, terms such as "first" and "second" are used only for the purpose of description, and cannot be understood as indicating or suggesting relative importance.

In addition, technical features included in the different implementations of the present application that are described below may be combined with each other provided that there is no conflict.

Figure 1:
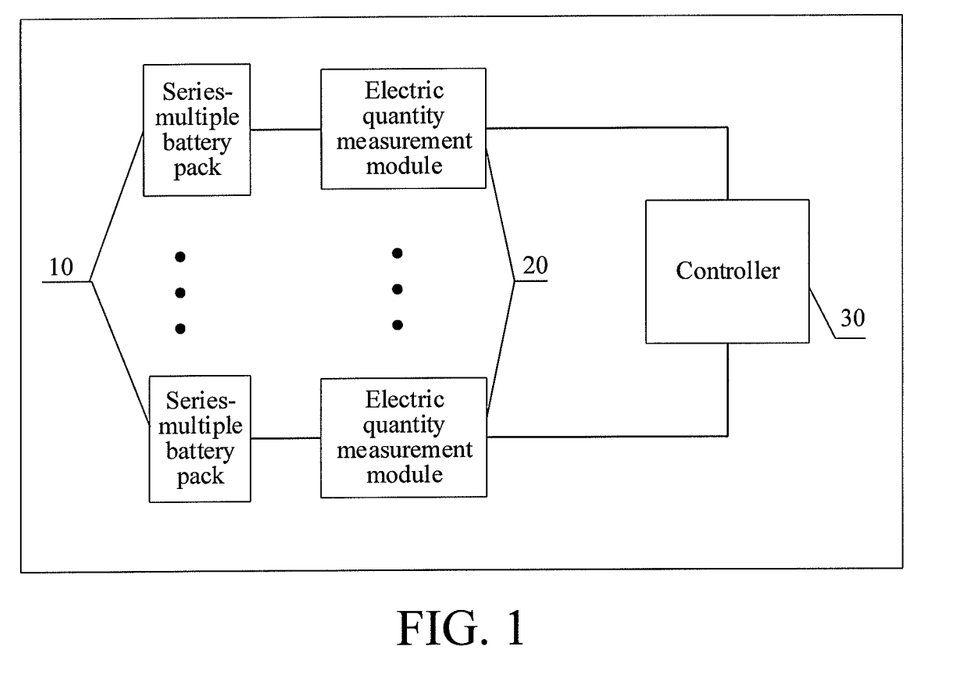
FIG. 1 is a schematic framework diagram of a series-multiple battery pack management system according to a first embodiment of the present application.

In a first embodiment of the present application, as shown in FIG. 1, a series-multiple battery pack management system is provided. It should be noted that, the "series-multiple battery pack" as called may be a group of four batteries in series, or the quantity of batteries in series may be determined according to an actual requirement. The system may include: a plurality of series-multiple battery packs 10, a plurality of electric quantity measurement modules 20 and a controller 30.

For the plurality of series-multiple battery packs 10, in different implementations, a series-multiple battery pack 10 may include four, six, or eight batteries connected in series or may include other quantities of batteries connected in series. In this embodiment, the quantity of batteries connected in series is not limited. Specifically, the quantity of batteries connected in series may be selected according to an actual situation. In this embodiment, the battery may be a lithium battery or a lead storage battery. Models of series-multiple batteries in a same group may be the same or may be different. This is not limited in this embodiment.

The plurality of electric quantity measurement modules 20 are respectively connected to the plurality of series-multiple battery packs 10. The controller 30 is respectively connected to the plurality of electric quantity measurement modules 20, and is configured to manage the plurality of series-multiple battery packs 10. In some implementations, the plurality of electric quantity measurement modules 20 obtains parameter information of the plurality of series-multiple battery packs 10. The controller 30 manages the plurality of series-multiple battery packs 10 according to the obtained parameter information. The management on the series-multiple battery packs includes, for example, electric quantity detection, impedance tracking and in-depth intelligent learning on the series-multiple battery packs, and protection function enabling for an abnormal state such as over-charging, over-discharging, over-current, short circuit, over-temperature or under-temperature. In a specific embodiment, the electric quantity measurement modules 20 perform in-depth learning on statuses of the series-multiple battery packs 10, to obtain parameter information of the series-multiple battery packs 10, and compensate for the parameter information of the series-multiple battery packs 10 according to the obtained parameter information, to obtain compensation parameters. In a specific embodiment, the parameter information of the series-multiple battery packs 10 may include voltage information of the plurality of series-multiple battery packs 10, major loop current information, and percentage information of electric quantity and temperature information of the plurality of series-multiple battery pack 10, and may also include parameter information of the plurality of series-multiple battery packs 10 which represents battery statuses, for example, electric quantity information and impedance information. The parameter information of the series-multiple battery packs 10 is acquired by electric quantity measurement modules 20 respectively connected to the plurality of series-multiple battery packs 10. In this embodiment, a BQ40Z50 electric quantity measurement chip may be adopted in the electric quantity measurement module 20. The chip can support a battery pack including one to four batteries connected in series, and has highly accurate voltage, current and temperature sampling functions. The plurality of electric quantity measurement modules 20 is connected in a one-to-one correspondence to the plurality of series-multiple battery packs 10, and can perform in-depth learning on various states of the series-multiple battery packs 10. For example, the electric quantity measurement modules 20 can continuously learn a plurality of states such as an impedance increase caused by aging of the series-multiple battery packs 10, an impact of a temperature on the battery and impacts of impedance and the temperature on the electric quantity or a voltage of the battery.

In this embodiment, a topology model or a nerve net may be established by means of in-depth learning of various states of a battery. When the battery electric quantity is measured, analysis and compensation are made on various parameters of the battery by using the established topology model or nerve net to obtain a compensation parameter corresponding to a current status of the battery. For example, compensation may be made on a temperature curve of the battery to adapt to a current temperature of the series-multiple battery pack 10, or compensation may be made on impedance of the battery to enable the series-multiple battery pack 10 to be charged and discharged according to actual impedance. Exemplarily, the electric quantity measurement module 20 may further include a register. The compensation parameter of the series-multiple battery pack 10 obtained after the compensation may be stored in the register, in order to be invoked at any time.

The controller 30, respectively connected to the plurality of electric quantity measurement modules 20, is configured to obtain compensation parameters, and do statistics on compensation parameters to obtain a measurement result. Exemplarily, the controller 30 can do statistics on compensation parameters of all the series-multiple battery packs 10 according to the compensation parameters of the series-multiple battery packs 10 that are stored in registers of the electric quantity measurement modules 20, to form data information of an entire battery package. The entire battery package includes the plurality of series-multiple battery packs 10 connected in series. For example, the plurality of series-multiple battery packs 10 is connected in series. Therefore, the controller 30 may add up voltages of the series-multiple battery packs 10 in the plurality of series-multiple battery packs 10 as a voltage of the entire battery package, and may add up electric quantities of the series-multiple battery packs 10 in the plurality of series-multiple battery packs 10 as the electric quantity of the entire battery package. Currents of the series-multiple battery packs 10 connected in series are the same. The current of the last pack of the series-multiple battery packs 10 may be selected as a current of the entire battery package. In the plurality of series-multiple battery packs 10, a temperature of a battery pack whose temperature value is the maximum or a temperature of a battery whose temperature is the highest may be selected as a temperature of the entire battery package. After obtaining the measurement result by doing statistics on the compensation parameters, the controller 30 uses information of the voltage, the electric quantity, the current and the temperature of the battery package that are calculated as the measurement result, to represent current status information of the plurality of series-multiple battery packs 10. The controller manages the plurality of battery packs according to the measurement result. For example, the controller performs voltage balancing or temperature compensation among the plurality of battery packs. Specifically, the controller may send, according to a voltage, a temperature or the like among the plurality of battery packs, voltages, currents or temperatures of the battery packs that need to be compensated for to the electric quantity measurement modules 20. The electric quantity measurement modules 20 perform intra-pack balancing on the battery packs according to the voltages, currents or temperatures that need to be compensated for. The measurement result may also be sent to an external host system. The external host system may be a product or a device using the series-multiple battery pack management system, for example, may be various loads such as an unmanned aerial vehicle or an electric vehicle, which allows a user to perform various processing, for example, power off or restart, according to the foregoing measurement result.

Figure 2:
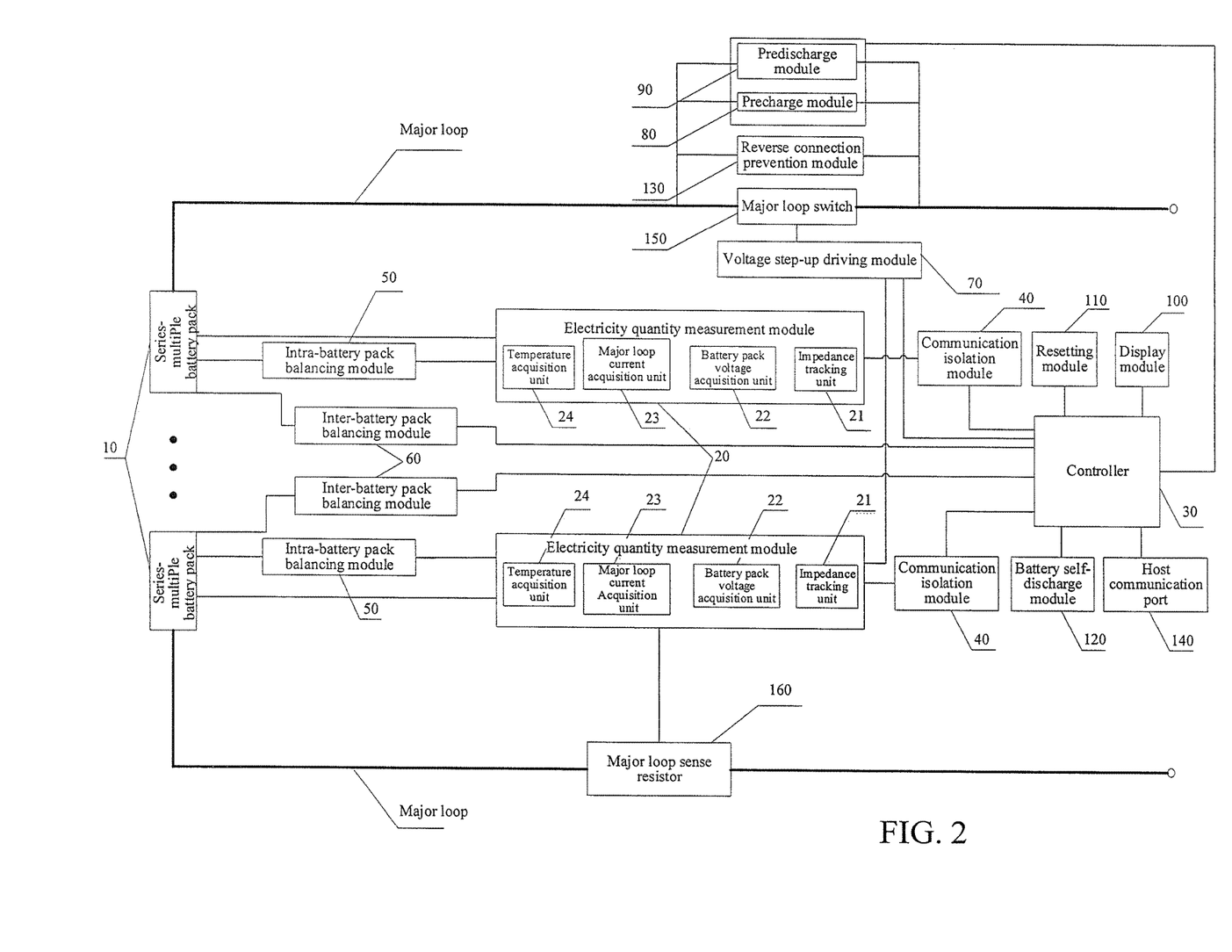
FIG. 2 is a schematic framework diagram of a series-multiple battery pack management system according to a second embodiment of the present application.

FIG. 2 shows a series-multiple battery pack management system according to a second embodiment of the present application. In addition to a plurality of series-multiple battery packs 10, a plurality of electric quantity measurement modules 20 and a controller 30, the system further includes other modules such as a communication isolation module 40, an intra-battery pack balancing module 50, an inter-battery pack balancing module 60 and a voltage step-up driving module 70. Since the plurality of series-multiple battery packs 10, the plurality of electric quantity measurement modules 20 and the controller 30 that are included in the second embodiment are the same as those in the first embodiment, details are not described herein again. The following describes other modules included in the second embodiment in detail. A person of ordinary skill should understand that, FIG. 2 shows a series-multiple battery pack management system according to one of the embodiments of the present application. Other embodiments of the present application do not necessarily include all of the modules shown in FIG. 2, but may include one or more of the modules shown in FIG. 2.

FIG. 2 shows a series-multiple battery pack management system constructed by the electric quantity measurement modules 20, the controller 30, the communication isolation module 40 and the like. The controller 30 may communicate with an external host system by using a host communication port 140. Specifically, the host communication port 140 may communicate by using the RS485 communication protocol. In different implementations of the present application, other communication protocols that can be used for transmitting a measurement result are also applicable. The external host system may correspondingly adjust a current working status of a host according to information such as a voltage, a capacity, a current and a temperature in the measurement result.

In this embodiment, the plurality of electric quantity measurement modules 20 further includes: a battery pack voltage acquisition unit 22, connected to the series-multiple battery packs 10 each connected to the plurality of electric quantity measurement modules 20, and configured to acquire the voltage information of the series-multiple battery packs 10; a major loop current acquisition unit 23, connected to a major loop, and configured to acquire the major loop current information; and a temperature acquisition unit 24, connected to the series-multiple battery packs 10 each connected to the plurality of electric quantity measurement modules 20, and configured to acquire the temperature information of the series-multiple battery packs 10. In a specific embodiment, a voltage and a current of a battery pack may be acquired by using a voltage sampling unit and a current sampling unit in an electric quantity measurement chip. In this embodiment, a current and a temperature may be acquired by using a peripheral circuit or apparatus of the measurement chip. For example, a major loop sense resistor 160 may be disposed on the major loop to acquire a current of the major loop. A current value of the major loop may be calculated by using a resistance value and a voltage value of the major loop sense resistor 160. The current value of the major loop is compared with a threshold, to implement monitoring and management on the current of the major loop. A temperature sensor may be disposed on each of the series-multiple battery packs 10, to acquire temperatures of the series-multiple battery packs 10. When the parameter information is acquired, information of total voltages, currents and temperatures of the series-multiple battery packs 10 may be acquired, or information of a voltage, a current and a temperature of each battery in the series-multiple battery pack 10 may be acquired respectively.

An impedance change, particularly an impedance increase caused by battery aging, has a relatively great impact on a charging or discharging power, a voltage and a capacity of a battery. To reduce the impact of the impedance increase on the measurement result of the battery, in one of the embodiments, learning on statuses of the series-multiple battery packs 10 by the plurality of electric quantity measurement modules 20 may include tracking impedance of the series-multiple battery packs 10. In this embodiment, the electric quantity measurement modules 20 may include an impedance tracking unit 21, configured to track impedance of the series-multiple battery packs 10 respectively connected to the electric quantity measurement modules 20, so as to obtain aging statuses of the series-multiple battery packs 10. The aging status of the series-multiple battery pack 10 has a relatively great impact on a voltage, a capacity and the like of a battery. As the series-multiple battery pack 10 ages, the impedance of the series-multiple battery pack 10 continuously increases. The impedance tracking unit may obtain impedance information of the series-multiple battery pack 10 in real time, so that the electric quantity measurement module 20 compensates for an output voltage of the series-multiple battery pack 10 or compensates for a temperature curve of the series-multiple battery pack 10, so as to implement accurate electric quantity measurement.

In order to protect the system stability and system security, and prevent an error from occurring in data transmission, in this embodiment, the series-multiple battery pack management system may further include a plurality of communication isolation modules 40. One side of each of the plurality of communication isolation modules 40 is connected to one electric quantity measurement module 20 and the other side is connected to the controller 30, the plurality of communication isolation modules 40 being configured to read compensation parameters from the plurality of electric quantity measurement modules 20 under the control of the controller 30, and transmit the compensation parameters to the controller 30. The plurality of communication isolation modules 40 is further configured to transmit, under the control of the controller 30, the measurement result obtained by the controller 30 by doing statistics on the compensation parameters to the plurality of electric quantity measurement modules 20.

Figure 3:
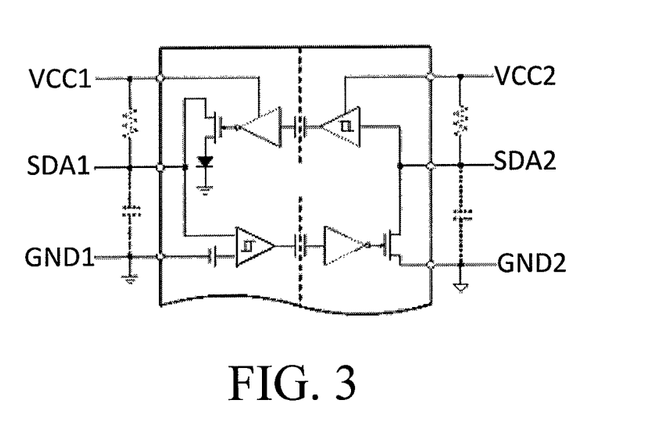
FIG. 3 is a schematic diagram of a communication isolation module of a series-multiple battery pack management system according to an embodiment of the present application.

Exemplarily, the core of the communication isolation module 40 is a two-way isolation IC shown in FIG. 3. A barrier isolates logic input and output buffers of the two-way isolation IC. Two ground ends of the two-way isolation IC are respectively connected to a first reference ground GND1 and a second reference ground GND2, so that interference or damage to a sensitive circuit due to entering of a noise current can be avoided. A first power supply end VCC1 and a second power supply end VCC2 are respectively adopted on two sides of an isolation chip for supplying power. It should be noted that, a first input end SDA1 is connected to a corresponding electric quantity measurement module 20 and a second input end SDA2 is connected to the controller 30, to prevent the controller 30 from being incapable of identifying a data signal due to a clamping voltage of a transistor. The controller 30 drives, by outputting and reading a driving signal, the communication isolation modules 40 to read information of a voltage, a current, a temperature, an electric quantity percentage and the like acquired by corresponding electric quantity measurement modules 10. Similarly, the controller 30 may further drive, by outputting a transmission driving signal, the communication isolation modules 40 to output a measurement result to the corresponding electric quantity measurement modules 20. The interference or damage to the sensitive circuit due to the entering of the noise current can be avoided by disposing the communication isolation modules 40, so that information of a voltage, a current, a temperature, a capacity, an electric quantity percentage and the like obtained by the controller 30 by using the electric quantity measurement module 20 is more accurate.

To prevent over-charging, over-discharging or different aging levels caused due to uneven use from occurring in a battery, in this embodiment, the series-multiple battery pack management system further includes a plurality of intra-battery pack balancing modules 50. One side of each of the plurality of intra-battery pack balancing modules 50 is connected to one of the series-multiple battery packs 10 and the other side is connected to the electric quantity measurement module 20 connected to the series-multiple battery pack 10, the plurality of intra-battery pack balancing modules 50 being configured to balance voltages of batteries within the series-multiple battery packs 10 under the control of the electric quantity measurement modules 20. In a specific embodiment, for balance within a series-multiple battery pack 10, a balancing module in the electric quantity measurement module 20 may be used to control balance of a voltage of each battery within the series-multiple battery pack 10. In this way, the voltage of each battery within the series-multiple battery pack 10 is balanced.

Figure 4:
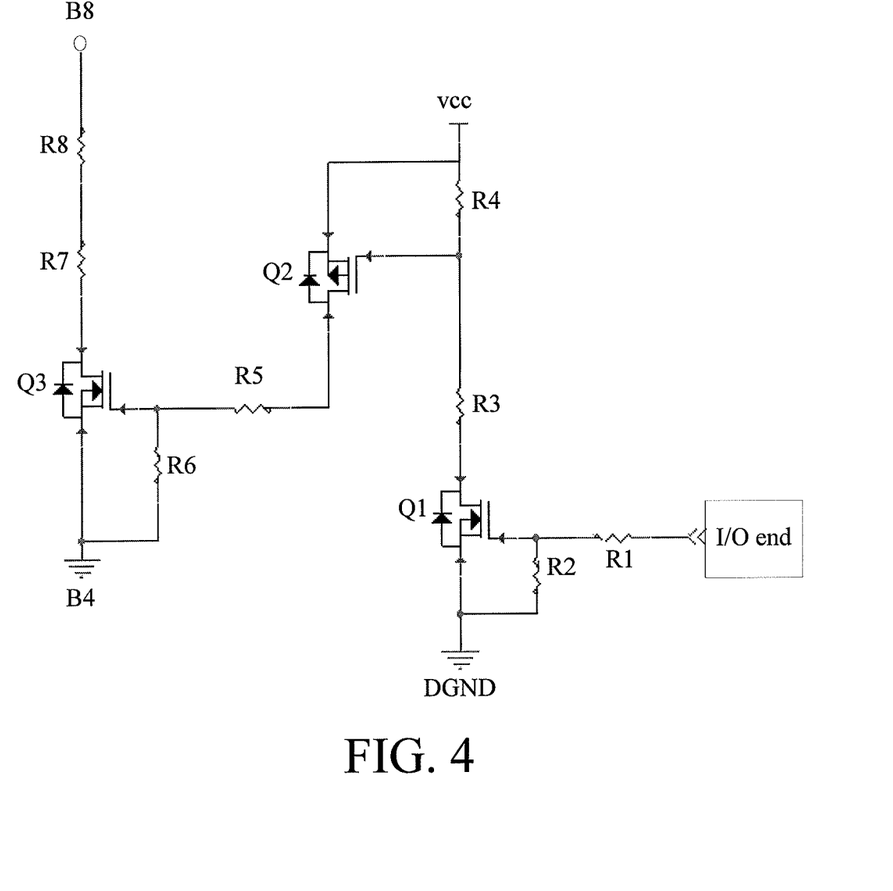
FIG. 4 shows a balancing circuit among battery packs of a series-multiple battery pack management system according to an embodiment of the present application.

Exemplarily, the series-multiple battery pack management system according to the embodiment of the present application further includes at least one inter-battery pack balancing module 60. One side of each of the at least one inter-battery pack balancing module 60 is connected to at least two series-multiple battery packs 10 and the other side is connected to the controller 30, so as to respectively balance a voltage among the plurality of series-multiple battery packs 10 under the control of the controller 30. Due to the electrical level incompatibility, direct control cannot be performed. Electrical level conversion can be implemented by disposing the inter-battery pack balancing module 60, thereby controlling a high voltage circuit by using a low voltage circuit. In a specific embodiment, balance among the series-multiple battery packs 10 is implemented by the controller 30 by controlling a balancing circuit among the battery packs. A specific implementation process is: when a battery is being charged or is static, the controller 30 controls a balancing circuit to discharge a battery pack whose voltage is the highest, and successively discharge a battery pack whose voltage is higher, until voltages of each of the battery packs are equal. The controller 20 controls the gate of a first transistor Q1 by using an I/O end, and further controls the gates of a second transistor Q2 and a third transistor Q3 by means of voltage division by using a resistor, so that a high voltage can be controlled by using a low voltage, and different voltages of the series-multiple battery packs 10 can be balanced, to achieve a balance among the voltages of the series-multiple battery packs 10. Take eight series-multiple battery packs 10 for example, in one implementation, FIG. 4 shows an exemplary circuit applicable to a balancing circuit among the eight series-multiple battery packs. In the exemplary circuit, one end of a first resistor R1 is connected to an I/O end of the controller 20 and the other end is respectively connected to the gate of a first transistor Q1 and one end of a second resistor R2. The other end of the second resistor R2 is connected to the source of the first transistor Q1, and connected to a reference ground DGND of a first series-multiple battery pack. The drain of the first transistor Q1 is connected to one end of a third resistor R3. The other end of the third resistor R3 is connected to the gate of the second transistor Q2. A fourth resistor R4 is disposed between the gate and the drain of the second transistor Q2. The drain of the second transistor Q2 is connected to a reference voltage VCC. The source of the second transistor Q2 is connected to the gate of the third transistor Q3 by using a fifth resistor R5. A sixth resistor R6 is disposed between the gate and the source of the third transistor Q3. The source of the third transistor Q3 is connected to a fourth series-multiple battery pack B4. The drain of the third transistor Q3, a seventh resistor R7 and an eighth resistor R8 are connected to an eighth series-multiple battery pack B8.

When an abnormal state such as over-voltage, under-voltage, over-temperature or under-temperature occurs in the series-multiple battery pack 10, it is needed to arrange a major loop switch 150 in the major loop, so as to prevent the abnormal state from damaging the series-multiple battery pack 10, that is, the system. The major loop switch 150 needs to respond to the abnormal state occurring in the battery packs. When the abnormal state occurs, the major loop switch 150 disconnects the series-multiple battery pack 10 from a load, to protect the series-multiple battery pack. In order to ensure that the major loop switch 150 can respond to the abnormal state of the series-multiple battery pack 10 in time, in one of the embodiments, the series-multiple battery pack management system may further include a voltage step-up driving module 70. One side of the voltage step-up driving module 70 is connected to an electric quantity measurement module 20 connected to one series-multiple battery pack 10 and the other side is connected to the controller 30. The electric quantity measurement module 20 of the series-multiple battery pack 10 outputs, under the triggering by a measurement result, a voltage step-up signal used for driving the voltage step-up driving module 70, so that the voltage step-up driving module 70 controls the major loop switch 150 to be switched off. In a specific embodiment, after the measurement result is sent to the electric quantity measurement module 20, the electric quantity measurement module 20 may detect the measurement result. When detecting that the measurement result includes the abnormal state such as over-voltage, under-voltage, over-temperature or under-temperature, the electric quantity measurement module 20 of the series-multiple battery pack 10 outputs a voltage step-up signal used for driving the voltage step-up driving module 70 to be turned on, so that the voltage step-up driving module 70 controls the major loop switch 150 to be switched off. In this embodiment, as long as there is one of the plurality of series-multiple battery packs 10 is in the abnormal state, the voltage step-up driving module 70 corresponding to the series-multiple battery pack 10 would drive the major loop switch 150 to be switched off. A working principle of the voltage step-up driving module 70 is: at an output end of the system, the major loop switch 150 for example, a transistor switch, may be disposed, the major loop switch 150 being switched on when driven by a high level signal or switched off when driven by a low level signal, to control output of the system. In an implementation, the voltage step-up driving module 70 is connected to an electric quantity measurement module 20 whose voltage is the lowest. In another implementation, the voltage step-up driving module 70 may be connected to another electric quantity measurement module 20. In this embodiment, voltage driving energy of the series-multiple battery pack 10 (the top series-multiple battery pack 10 shown in FIG. 2) whose voltage is the highest is usually sufficient to drive the major loop switch 150. Therefore, an electric quantity measurement module 20 of the series-multiple battery pack 10 whose voltage is the highest can use a driver built therein to control the major loop switch 150. The electric quantity measurement module 20 of the battery pack whose voltage is the highest does not need to be connected to the voltage step-up driving module 70. Instead, it can be directly connected to the major loop switch 150. However, due to insufficient voltage driving energy of series-multiple battery packs 10 (the plurality of series-multiple battery packs 10 except the top one in FIG. 2) whose voltages are low, the voltage step-up driving module 70 needs to perform voltage step-up driving on the major loop switch 150. Generally, the voltage step-up driving module 70 is controlled by using a booster pump chip. Power is supplied to the booster pump chip by using a voltage of a positive electrode of the series-multiple battery pack 10. A ground end is connected to the negative electrode of the series-multiple battery pack 10. It should be noted that, the voltage driving energy of the series-multiple battery pack 10 whose voltage is the highest is usually sufficient to drive the major loop switch 150. The series-multiple battery pack 10 can use a driver built therein to control the major loop switch 150 but does not need to use the voltage step-up driving module 70. Therefore, in different implementations, the voltage step-up driving module 70 of the present application is generally connected to any electric quantity measurement module 20 other than the electric quantity measurement module 20 corresponding to the series-multiple battery pack 10 whose voltage is the highest. After inversion processing is performed on the voltage step-up signal of the electric quantity measurement module 20, the voltage step-up signal is used to directly control the major loop switch 150, ensuring a speed at which the system responses to an abnormal state of a series-multiple battery pack 10.

To reduce damage to a battery caused by a large current in a case of large loads, in order to avoid that the load cannot be started, in one of the embodiments, the series-multiple battery pack management system may further include a precharge module 80, respectively connected to the plurality of series-multiple battery packs 10 and the controller 30, and configured to be turned on when being driven by a precharge signal output from the controller 30 which is used for controlling precharge of the series-multiple battery pack 10, so as to charge the series-multiple battery packs 10 in a trickle charging manner. Before a battery is charged, the controller 30 may determine whether a current voltage of the series-multiple battery pack 10 satisfies a precharge condition. For example, the precharge condition may be that the current voltage of the series-multiple battery pack 10 is less than a preset voltage value. If the precharge condition is satisfied, the controller 30 may control a switch in the precharge module 80 to be switched on, so that a charge loop passes through a relatively large power resistance and a charging current is reduced. Therefore, the battery is charged by using a small current. After the voltage of the series-multiple battery pack 10 reaches the preset voltage value, the controller 30 may control the switch in the precharge module 80 to be switched off, so that the major loop is switched back to normally charge the battery. A predischarge module 90 is respectively connected to the plurality of series-multiple battery packs 10 and the controller 30, and configured to be turned on when being driven by a predischarge signal output from the controller 30 which is used for controlling the series-multiple battery packs 10 to be predischarged, so that the series-multiple battery packs 10 discharges the load in a trickle discharging manner. When the system discharges the load, if the system detects that the load exceeds a preset load value, the system may control a switch in the predischarge module 90 to be switched on, so that the system discharges the load by using a small current. After discharging the load for a predetermined period of time, the system controls the switch in the predischarge module 90 to be switched off, so that the major loop is switched back to normally discharge the battery. It should be understood that, in different implementations, the precharge module 80 may charge only one of the series-multiple battery packs, or may charge the plurality of series-multiple battery packs at the same time. The predischarge module 90 may discharge only one of the series-multiple battery packs, or may discharge the plurality of series-multiple battery packs at the same time. By means of the foregoing implementation, damage to the battery caused by a large current during a charging process or a discharging process can be effectively avoided.

In one of the embodiments, the series-multiple battery pack management system may further include a display module 100, connected to the controller 30, and configured to display a measurement result. In a specific embodiment, the display module 100 may be a screen having a display function, such as an LED screen or a liquid crystal display screen. Display content may be information of a current capacity, voltage, current, temperature and the like of a series-multiple battery pack, so that a user can relatively clearly observe a real-time status of the battery pack.

In one of the embodiments, the series-multiple battery pack management system further includes a resetting module 110, connected to the controller 30, and configured to reset the controller 30. When an erroneous control signal occurs in the controller 30, the erroneous control signal of the controller 30 may be corrected by means of resetting, ensuring the stability of the system. A reset chip circuit may be adopted in the resetting module 110. The controller 30 may be forced to be reset in a manner such as pressing and holding a preset key.

In one of the embodiments, the series-multiple battery pack management system may further include a battery self-discharge module 120, connected to the controller 30. Driven by a self-discharge signal output from the controller 30 which is used for controlling a series-multiple battery pack 10 to be self-discharged, the battery self-discharge module 120 is turned on when the battery is in a storage state, to control the series-multiple battery pack 10 to be discharged in a small current discharging manner. When the battery needs to be stored, a switch in the battery self-discharge module 120 may be controlled to be switched on, to discharge the battery by using a small current, so that a voltage of the battery is within a proper voltage range, thereby enhancing the storage safety of the battery.

In one of the embodiments, the series-multiple battery pack management system may further include a reverse connection prevention module 130, connected in parallel to the major loop switch 150, and configured to control, during reverse charging, the major loop switch to be switched off. In a specific embodiment, the major loop switch 150 may be a field effect transistor. Specifically, a field effect transistor for preventing reverse connection may be disposed between the gate and the source of the major loop switch 150. When there is a reverse charging current, the field effect transistor for preventing reverse connection is turned on, so that an electrical potential of the gate of the major loop switch 150 is lowered to be the same as that of the source, to switch off the major loop switch 150. For the reverse connection prevention module 130, a withstand voltage of the gate of the major loop switch 150 needs to be considered. Divider resistance values suitable for switching off and switching on the major loop switch 150 need to be calculated. In addition, it needs to be ensured that the major loop switch 150 is not damaged during normal operation.

A principle of the series-multiple battery pack management system is described according to FIG. 1 to FIG. 4. An example in which one pack includes four batteries is used in the system. An electric quantity measurement chip, for example, an electric quantity measurement chip whose model is BQ40Z50, is used for each pack. After in-depth learning on various statuses of the series-multiple battery pack is performed, acquired data about a voltage, a current, a temperature and the like may be analyzed and compensated for according to a result of the learning, to obtain a compensation parameter corresponding to a current status of the battery after the compensation and perform accurate measurement on the battery pack. Then, the electric quantity measurement chip of each pack sends acquired compensation parameters of corresponding battery packs to the controller 30. The controller 30 does statistics on the information of a voltage, a current, a temperature and the like of each battery pack, and selects a sum of voltages of the series-multiple battery packs 10, a current of the last series-multiple battery pack 10 and a temperature of the battery pack whose temperature is the highest in the series-multiple battery packs 10 as data information of an entire battery package. Then, the controller 30 feeds back the data information of the entire battery package to the electric quantity measurement modules 20. The electric quantity measurement modules 20 quickly and effectively protect the series-multiple battery packs 10 according to the data information of the entire battery package, to ensure the stability and security of the protective properties of the entire system. The electric quantity measurement chip of each battery pack can balance a battery voltage within each pack. The controller 30 balances voltages among the battery packs by controlling the inter-battery pack balancing module 60, to ensure that voltages of batteries in the series-multiple battery packs 10 are maintained consistent. The measurement chip of each battery pack in the series-multiple battery packs 10 may communicate with the controller 30 by using, for example, an inter-integrated circuit (I2C) bus.

In-depth learning on a status of the series-multiple battery pack is performed by using the electric quantity measurement module. Compensation for the parameter information of the series-multiple battery pack is made according to a result of the in-depth learning, to obtain a compensation parameter, so that a relatively accurate parameter of the series-multiple battery pack may be obtained. A controller does statistics on the compensation parameters of a plurality of series-multiple battery packs, to select a compensation parameter that can represent current electric quantity information as a measurement result, so that relatively accurate current electric quantity information and a relatively accurate current battery use status can be obtained. Therefore, the battery electric quantity of the battery management system can be measured more accurately.

Finally, it should be noted that, the foregoing embodiments are merely intended for describing the technical solutions of the present application, but not for limiting the present application. Based on the thinking of the present application, the foregoing embodiments or technical features in different embodiments may be combined, and steps may be performed in any sequence. There are many other variations in the foregoing different aspects of the present application. For brevity, they are not provided in detail. Although the present application is described in detail with reference to the foregoing embodiments, a person of ordinary skill in the art should understand that they may still make modifications to the technical solutions described in the foregoing embodiments, or make equivalent replacements to some technical features thereof, without departing from the scope of the technical solutions of the embodiments of the present application.

What is claimed is:

1. A series-multiple battery pack management system, comprising:
   a plurality of series-multiple battery packs;
   a plurality of electric quantity measurement modules, respectively connected to the plurality of series-multiple battery packs;
   a controller, respectively connected to the plurality of electric quantity measurement modules, and configured to manage the plurality of series-multiple battery packs;
   a precharge module, respectively connected to the plurality of series-multiple battery packs and the controller, and configured to be turned on under the control of the controller, to charge the plurality of series-multiple battery packs in a trickle charging manner; and
   a predischarge module, respectively connected to the plurality of series-multiple battery packs and the controller, and configured to be turned on under the control of the controller, to discharge the plurality of series-multiple battery packs in a trickle discharging manner.

2. The series-multiple battery pack management system according to claim 1, wherein the plurality of electric quantity measurement modules obtains parameter information of the plurality of series-multiple battery packs and obtains compensation parameters according to the parameter information, the controller managing the plurality of series-multiple battery packs according to the compensation parameters.

3. The series-multiple battery pack management system according to claim 2, wherein the parameter information comprises at least one of the following: major loop current information, voltage information of the plurality of series-multiple battery packs, temperature information of the plurality of series-multiple battery packs and percentage information of electric quantity.

4. The series-multiple battery pack management system according to claim 3, wherein the electric quantity measurement module further comprises at least one of the following:
   a major loop current acquisition unit, connected to a major loop, and configured to acquire the major loop current information;
   a battery pack voltage acquisition unit, connected to the series-multiple battery packs connected to the electric quantity measurement modules, and configured to acquire the voltage information of the series-multiple battery packs; and
   a temperature acquisition unit, connected to the series-multiple battery packs connected to the electric quantity measurement modules, and configured to acquire the temperature information of the series-multiple battery packs.

5. The series-multiple battery pack management system according to claim 1, wherein the electric quantity measurement module further comprises an impedance tracking unit, configured to track impedance of the series-multiple battery packs connected to the electric quantity measurement modules and obtain aging information of the series-multiple battery packs according to the impedance of the series-multiple battery packs.

6. The series-multiple battery pack management system according to claim 2, wherein a communication isolation module is disposed between the electric quantity measurement modules and the controller;
   the controller obtains, by using the communication isolation module, the compensation parameters obtained by the plurality of electric quantity measurement modules; and
   the plurality of electric quantity measurement modules obtains, by using the communication isolation module, a measurement result obtained by the controller by doing statistics on the compensation parameters.

7. The series-multiple battery pack management system according to claim 1, further comprising an inter-battery pack balancing module, wherein one side of the inter-battery pack balancing module is connected to at least two of the series-multiple battery packs and the other side is connected to the controller, the inter-battery pack balancing module being configured to balance a voltage among the plurality of series-multiple battery packs under the control of the controller.

8. The series-multiple battery pack management system according to claim 1, further comprising a plurality of intra-battery pack balancing modules, wherein one side of each of the plurality of intra-battery pack balancing modules is connected to one of the series-multiple battery packs and the other side is connected to the electric quantity measurement module connected to the series-multiple battery pack, the plurality of intra-battery pack balancing modules being configured to balance voltages of batteries within the plurality of series-multiple battery packs under the control of the electric quantity measurement modules.

9. The series-multiple battery pack management system according to claim 1, further comprising a voltage step-up driving module, wherein one side of the voltage step-up driving module is connected to one of the electric quantity measurement modules and the other side is connected to the controller, the electric quantity measurement module of the series-multiple battery pack outputting, under the triggering of the measurement result, a voltage step-up signal used for driving the voltage step-up driving module to be turned on, so that the voltage step-up driving module controls a major loop switch to be switched off.

10. The series-multiple battery pack management system according to claim 1, further comprising:

a reverse connection prevention module, wherein the reverse connection prevention module is connected in parallel to the major loop switch, and is configured to control, during reverse charging, the major loop switch to be switched off.

11. The series-multiple battery pack management system according to claim 1, further comprising a battery self-discharge module, connected to the controller, and turned on under the control of the controller when the battery is in a storage state, to control the series-multiple battery pack to be discharged in a small current discharging manner.

12. The series-multiple battery pack management system according to claim 1, further comprising a major loop sense resistor disposed on the major loop, wherein the major loop sense resistor acquires a current of the major loop, and calculates a current value of the major loop by using a resistance value and a voltage value of the major loop sense resistor, the major loop sense resistor being configured to monitor and manage the current of the major loop.

13. The series-multiple battery pack management system according to claim 1, further comprising a resetting module, connected to the controller and configured to reset the controller.

\* \* \* \* \*